US011682466B2

(12) United States Patent
Li et al.

(10) Patent No.: US 11,682,466 B2
(45) Date of Patent: Jun. 20, 2023

(54) ONE-TIME PROGRAMMABLE MEMORY READ-WRITE CIRCUIT (71) Applicant: ChangXin Memory Technologies, Inc., Hefei (CN)

(72) Inventors: Xin Li, Hefei (CN); Zhan Ying, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 138 days.

(21) Appl. No.: 17/429,601

(22) PCT Filed: May 29, 2020

(86) PCT No.: PCT/CN2020/093244
§ 371 (c)(1),
(2) Date: Aug. 9, 2021

(87) PCT Pub. No.: WO2021/103468
PCT Pub. Date: Jun. 3, 2021

(65) Prior Publication Data
US 2022/0215891 A1   Jul. 7, 2022

(30) Foreign Application Priority Data

Nov. 28, 2019   (CN) .......................... 201911193859.8

(51) Int. Cl.
*G11C 17/16*   (2006.01)
*G11C 7/10*   (2006.01)
(Continued)

(52) U.S. Cl.
CPC .......... *G11C 17/165* (2013.01); *G11C 7/1069* (2013.01); *G11C 7/1096* (2013.01); *G11C 17/04* (2013.01); *G11C 17/18* (2013.01)

(58) Field of Classification Search
CPC ... G11C 17/165; G11C 7/1069; G11C 7/1096; G11C 17/04; G11C 17/18; G11C 29/027; G11C 7/22; G11C 17/16
(Continued)

(56) References Cited

U.S. PATENT DOCUMENTS 5,299,150 A     3/1994  Galbraith et al.
5,486,776 A *   1/1996  Chiang ............ H03K 19/17704
                                                    257/50
(Continued)

FOREIGN PATENT DOCUMENTS

WO   WO 2021/103468 A1   6/2021

OTHER PUBLICATIONS

PCT/CN2020/093244 International Search Report dated Jul. 1, 2020, English Translation.
(Continued)

*Primary Examiner* — Michael T Tran
(74) *Attorney, Agent, or Firm* — Alston & Bird LLP (57) ABSTRACT

A read-write circuit of a one-time programmable memory, including: an antifuse array including: n*n antifuse units, between a first node and a second node, the control terminals of switching elements in the antifuse units coupled to AND signals of different word line signals and bit line signals; the first switching device and the first capacitor connected in parallel between the second node and the second voltage source; the reference array including reference resistance and reference switching elements connected in series between the first and third nodes, the reference switching element's control end coupled to OR signals of the n*n AND signals; the second switching device and the second capacitor connected in parallel between the third node and second voltage source; a comparison circuit's first input terminal coupled to the second node and second input terminal
(Continued)

coupled to the third node. The circuit has simpler connections, smaller area, and higher reliability.

12 Claims, 7 Drawing Sheets

(51) Int. Cl.
 *G11C 17/04* (2006.01)
 *G11C 17/18* (2006.01)
(58) Field of Classification Search
 USPC .......................................... 365/225.7, 230.06
 See application file for complete search history.

(56) References Cited

U.S. PATENT DOCUMENTS

| | | | | |
|---|---|---|---|---|
| 7,321,518 | B1* | 1/2008 | Huang | H03K 19/1776 |
| | | | | 365/201 |
| 8,173,987 | B2* | 5/2012 | Lung | H10B 63/20 |
| | | | | 438/102 |
| 8,254,178 | B2 | 8/2012 | Kern | |
| 11,114,176 | B1* | 9/2021 | Lee | G11C 17/18 |
| 2006/0157679 | A1* | 7/2006 | Scheuerlein | G11C 13/0023 |
| | | | | 257/2 |
| 2006/0291316 | A1* | 12/2006 | Jenne | G11C 17/18 |
| | | | | 365/225.7 |
| 2007/0133269 | A1* | 6/2007 | Lee | G11C 17/165 |
| | | | | 365/163 |
| 2014/0253220 | A1* | 9/2014 | Kirihata | G11C 17/16 |
| | | | | 327/525 |
| 2015/0078061 | A1* | 3/2015 | Shirahama | G11C 17/08 |
| | | | | 365/103 |
| 2015/0131361 | A1* | 5/2015 | Ch | G11C 29/76 |
| | | | | 365/148 |
| 2015/0310930 | A1* | 10/2015 | Boldt | G11C 17/18 |
| | | | | 365/96 |
| 2015/0318050 | A1* | 11/2015 | Huang | G11C 17/16 |
| | | | | 365/96 |
| 2016/0005494 | A1* | 1/2016 | Choi | G11C 29/027 |
| | | | | 365/96 |
| 2017/0053716 | A1* | 2/2017 | Kim | G11C 29/24 |
| 2017/0076759 | A1* | 3/2017 | Katayama | G11C 29/026 |
| 2017/0092377 | A1* | 3/2017 | Eckert | G11C 29/32 |
| 2018/0108393 | A1 | 4/2018 | Vimercati | |
| 2019/0385049 | A1* | 12/2019 | Yang | G11C 17/16 |

OTHER PUBLICATIONS

Phan, et al., "A 2-Kb One-Time Programmable Memory for UHF Passive RFID Tag IC in a Standard 0.18 /spl mu/m CMOS Process," in *IEEE Transactions on Circuits and Systems I*: Regular Papers., vol. 60, No. 7. pp. 1810-1822, Jul. 2013, doi: 10.1109/TCSI.2012. 2230500, Abstract only.

\* cited by examiner

ONE-TIME PROGRAMMABLE MEMORY READ-WRITE CIRCUIT

CROSS REFERENCES TO RELATED APPLICATIONS

This application claims the benefit of priority to CN Patent Application 201911193859.8 filed on Nov. 28, 2019, entitled "One-Time Programmable Memory Read-Write Circuit", the contents of which are incorporated herein by reference in its entirety.

TECHNICAL FIELD

The present disclosure relates to the technical field of integrated circuits, and in particular to a read-write circuit of a one-time programmable memory.

BACKGROUND

One Time Programmable (OTP) memory can store data in multiple OTP cells which are either in an unprogrammed state or in a programmed state. An OTP unit usually includes a fuse element or an antifuse element. After the fuse element or the antifuse element is programmed, it will be in an unrecoverable state. This unrecoverable state will not be affected by power failures, so that data can be stored stably.

In Dynamic Random Access Memory (DRAM), an OTP unit is often used to control the opening or closing of a redundancy memory unit. For example, when a memory cell in a memory cell area corresponding to a word line is defective, the corresponding OTP cell will be programmed (the output state of the OTP cell changes from "0" to "1"), and the DRAM control circuit will turn off the reading and writing of the memory unit in the memory unit area, and will open the reading and writing of a memory unit in a redundant memory area, which then will replace the memory unit in the defective memory unit area with the corresponding memory unit in the redundant memory area, thereby repairing the DRAM detect.

Figure 1:
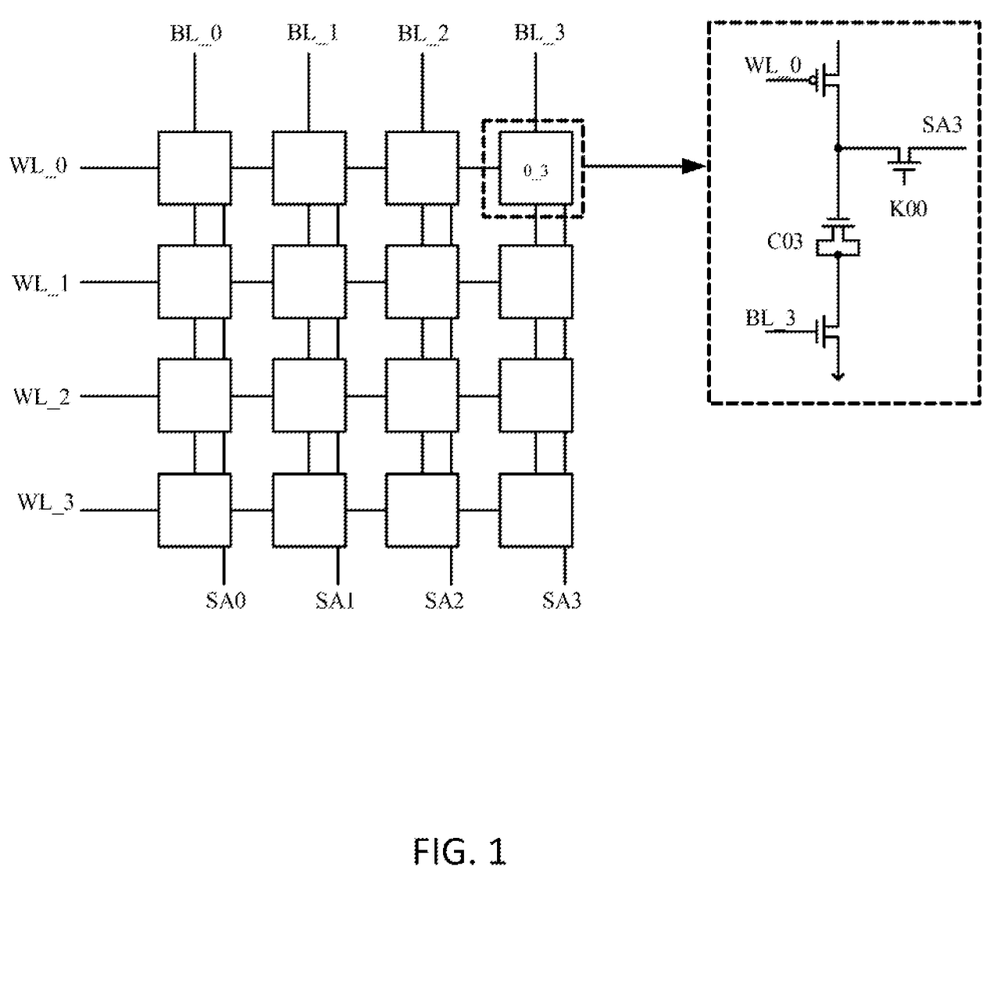
FIG. 1 is a schematic diagram of a read-write circuit in an OTP unit in the related art.

FIG. 1 is a schematic diagram of a read-write circuit of an OTP unit having bit lines BL_0, BL_1, etc. and word lines WL_0, WL_1, etc. in the related art. It can be seen from FIG. 1 that each memory cell, for example, 0_3, is connected with a corresponding antifuse element like C03 and a detection element SA3 (having control signal K00). This connection method in a large-scale integrated circuit will cause problems such as circuit area being too large and wiring being too complex, Due to the numerous components and complicated wiring, circuit reliability will be reduced as a result.

It should be noted that the information disclosed in the background art section above is only used to enhance understanding of the background of the present disclosure, therefore may include information that does not constitute prior art known to those of ordinary skill in the art.

SUMMARY

The present disclosure provides a read-write circuit of a one-time programmable memory, which is aired to overcome some of the problems such as large areas and complexity of the read-write circuits and low reliability caused by limitations and faults of the existing techniques.

One aspect of the present disclosure provides a read-write circuit of a one-time programmable memory, including: an antifuse array, which comprises n*n antifuse units, wherein each of the n*n antifuse units comprises an antifuse element and a switching element coupled together, wherein a first end of one of the n*n antifuse units is coupled to a first node, and a second end of said antifuse unit is connected to a second node, wherein a control end of the switching element in each of the n*n anti fuse units is respectively coupled to an AND signal of a word fine signal and a bit line signal different from word line signal, wherein a first node is coupled to a mirror current source, wherein the mirror current source is electrically connected to a first voltage source;

a first capacitor and a first switching device connected in a parallel between the second node and a second voltage source, wherein a control terminal of the first switching device is connected to a first control signal;

a reference array, comprising:

a reference resistor and a reference switch element connected in series between the first node and the third node, wherein a control end of the reference switch element is coupled to an OR signal of n*n AND signals;

a second capacitor and a second switching device connected in parallel between the third node and the second voltage source, wherein a control terminal of the second switching device is coupled to a second control signal; and a comparison circuit, wherein a first input terminal of the comparison circuit is coupled to the second node a second input terminal is coupled to the third node, and wherein the comparison circuit compares a voltage at the second node and a voltage at the third node and determines if a programed operation occurs at said antifuse unit.

In some examples, in a writing state, the first switching device is turned on and the second switching device is turned off; and wherein in a reading state, the first control signal and the second control signal are pulse signals having a same phase.

In some examples, in the read state, during a half cycle of the pulse signals, a ratio of the voltage of the second node to the voltage of the third node is greater than a first preset value, or the ratio of the voltage of the second node to the voltage of the third node is less than a second preset value.

In some examples, in the read state, when one word line is in an enabled state and one bit line is in an enabled state, the first switching device and the second switching device are turned on at a same time.

In some examples, in the writing state, the first voltage source is at a first voltage level, wherein in the reading state, the first voltage source is at a second voltage level, and wherein the first voltage level is greater than the second voltage level.

In some examples, the first switch device, the second switch device, and the reference switch element are all NMOS switching transistors.

In some examples, a resistance value of the reference resistor is smaller than a blocking-resistance value of the antifuse element and greater than an on-resistance value of the antifuse element.

In some examples, a resistance value of the reference resistor is less than or equal to one tenth of a blocking-resistance value of the anti fuse element, and greater than or equal to ten times of an on-resistance value of the antifuse element.

In some examples, the reference resistor is a variable resistor.

In some examples, capacitance values of the first capacitor and the second capacitor are equal.

DETAILED DESCRIPTION OF THE PREFERRED EMBODIMENTS

Implementations of the present disclosure are illustrated below through specific embodiments, Those skilled in the art can easily understand other advantages and efficacy of the present disclosure according to the content disclosed in this specification. The present disclosure can also be implemented or applied through other different specific implementations. Various modifications or variations can also be made on details in this specification based on different opinions and applications without departing from the spirit of the present disclosure.

It should be noted that, the figures provided in this embodiment merely illustrate the basic conception of the present disclosure schematically. Therefore, the figures only show components related to the present disclosure, and are not drawn according to the quantity, shapes and sizes of components during actual implementation. The pattern, quantity and ratio of components during actual implementation can be changed arbitrarily, and the component layout may also be more complex.

Exemplary embodiments will now be described more fully with reference to the accompanying drawings. However, the exemplary embodiments can be implemented in various forms, and should not be construed as being limited to the examples set forth herein; on the contrary, the provision of these embodiments makes the present disclosure more comprehensive and complete, and fully conveys the concept of the exemplary embodiments to those skilled in the art. The described features, structures or characteristics may be combined in one or more embodiments in any suitable way. In the following description, many specific details are provided to give a sufficient understanding of the embodiments of the present disclosure. However, those skilled in the art will realize that the technical solutions of the present disclosure can be practiced without one or more of the specific details, or other methods, components, devices, steps, etc. earl be used. In other cases, the well-known technical solutions are not shown or described in detail to avoid overwhelming the crowd and obscuring all aspects of the present disclosure.

In addition, the drawings are only schematic illustrations of the present disclosure, and the same reference numerals in the drawings denote the same or similar parts, and thus their repeated description will be omitted, Some of the block diagrams shown in the drawings are functional entities and do not necessarily correspond to physically or logically independent entities. These functional entities may be implemented in the form of software, or implemented in one or more hardware modules or integrated circuits, or implemented in different networks and/or processor devices and/or microcontroller devices.

Figure 2:
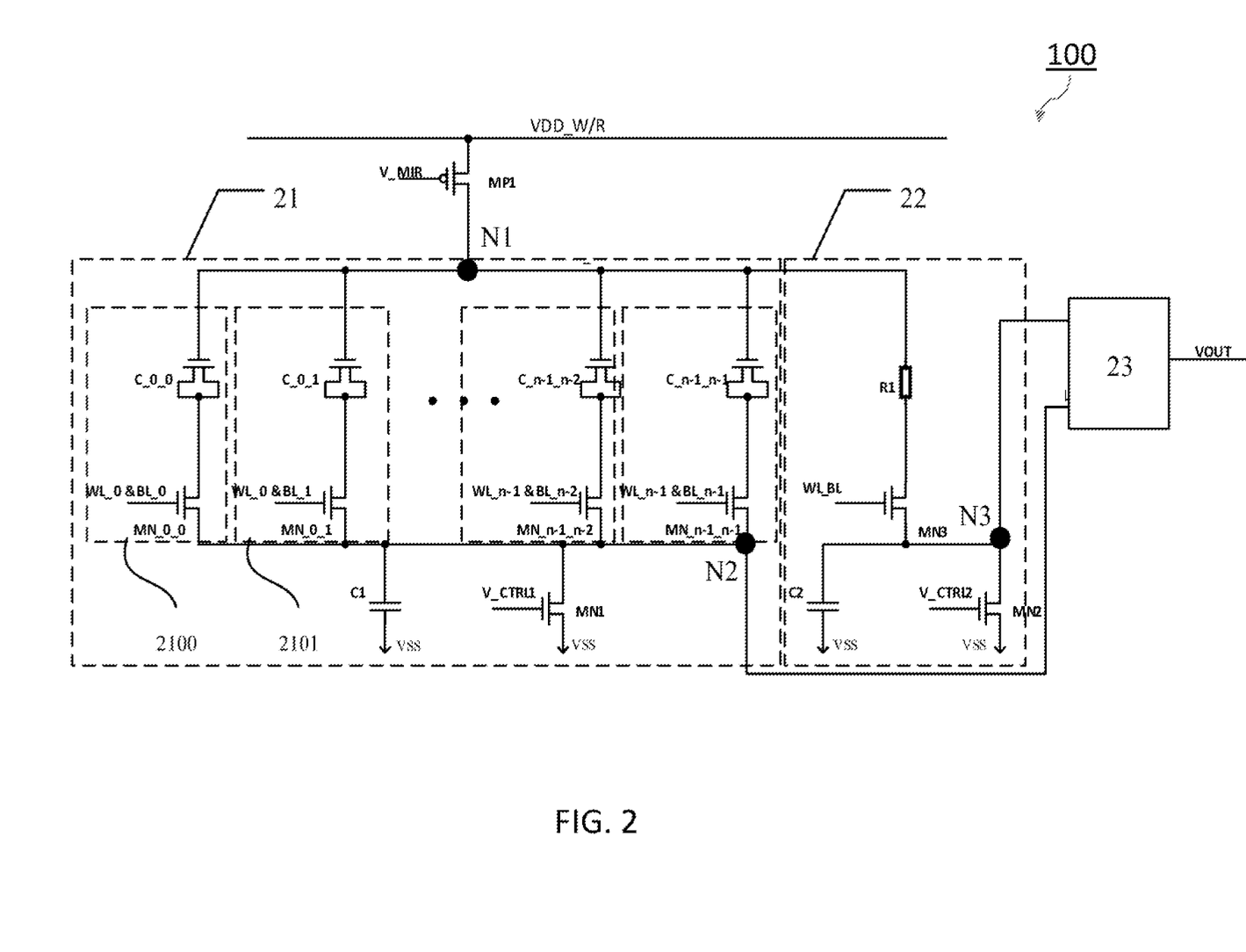
FIG. 2 is a schematic diagram of the structure in an exemplary embodiment of the present disclosure.

The exemplary embodiments of the present disclosure will be described in detail below with reference to the accompanying drawings FIG. 2 is a schematic diagram of the structure in an exemplary embodiment of the present disclosure.

Referring to FIG. 2, the read-write circuit 100 may include antifuse array and reference a The antifuse array 21 which includes the following.

Array n*n antifuse units 21xy (2100, 2101, . . . ), each of the antifuse units 21xy includes a coupled antifuse element C_x_y (C_0_0, C_0_1, . . . C_n−1_n−2, to C_n−1_n−1), and switching elements MN_x_y (MN_0_0, MN_0_1, . . . MN_n−1_n−2, MN_n−1_n−1), where x corresponds to the serial number of the write signal line, y is the serial number of the corresponding read signal line, x≤n, y≤n. The first end of the antifuse elements are all coupled to the mirror current source MP1 through the first common node N1, and the mirror current source MP1 is electrically connected to the first voltage source VDD_W/R and input V_MIR. The first end of the switching element is respectively coupled to the second end of each antifuse element, the second end of the switching element is coupled to the second common node N2, and the control end of the switching element is respectively coupled to the AND signal WL_x & BL_y from different word line signal WL_x and bit line signal BL_y.

The first switching device MN1 is coupled between the second node N2 and the second voltage source VSS, and the control terminal is coupled to the first control signal V_CTRL1.

The first capacitor C1 is connected in parallel with the first switching device MN1.

The reference array 22 includes the following elements.

The reference resistor R1 has the first end of the reference resistor R1 coupled to the mirror current source MP1 through the first common node N1.

The reference switch device MN3 has the first end of the reference switch device MN3 coupled to the second end of the reference resistor R1, the second end of the reference switch device MN3 is coupled to the third common node N3, and the control end the of reference switch device MN3 is coupled to the OR signal WL_BL of the n*n AND signal WL_x & BL_y, where WL_BL=WL_0&BL_0+ WL_0&BL_1+ . . . +WL_n−1&BL_n−2+WL_n−1&BL_n−1.

The second switch device MN2 is coupled between the third node N3 and the second voltage source VSS, and the control terminal is coupled to the second control signal V_CTRL2.

The second capacitor C2 is connected in parallel with the second switching device MN2.

The comparison circuit 23 has the first input terminal coupled to the second node N2, and the second input terminal is coupled to the third node N3, for determining if a corresponding antifuse element has a programming operation based on the voltage comparison result of the second node N2 and the third node N3.

Among these elements, the antifuse element may compose a MOS transistor, equivalent to a capacitor, which is in an off state before being programmed, and is in an on state after being programmed.

Figure 3:
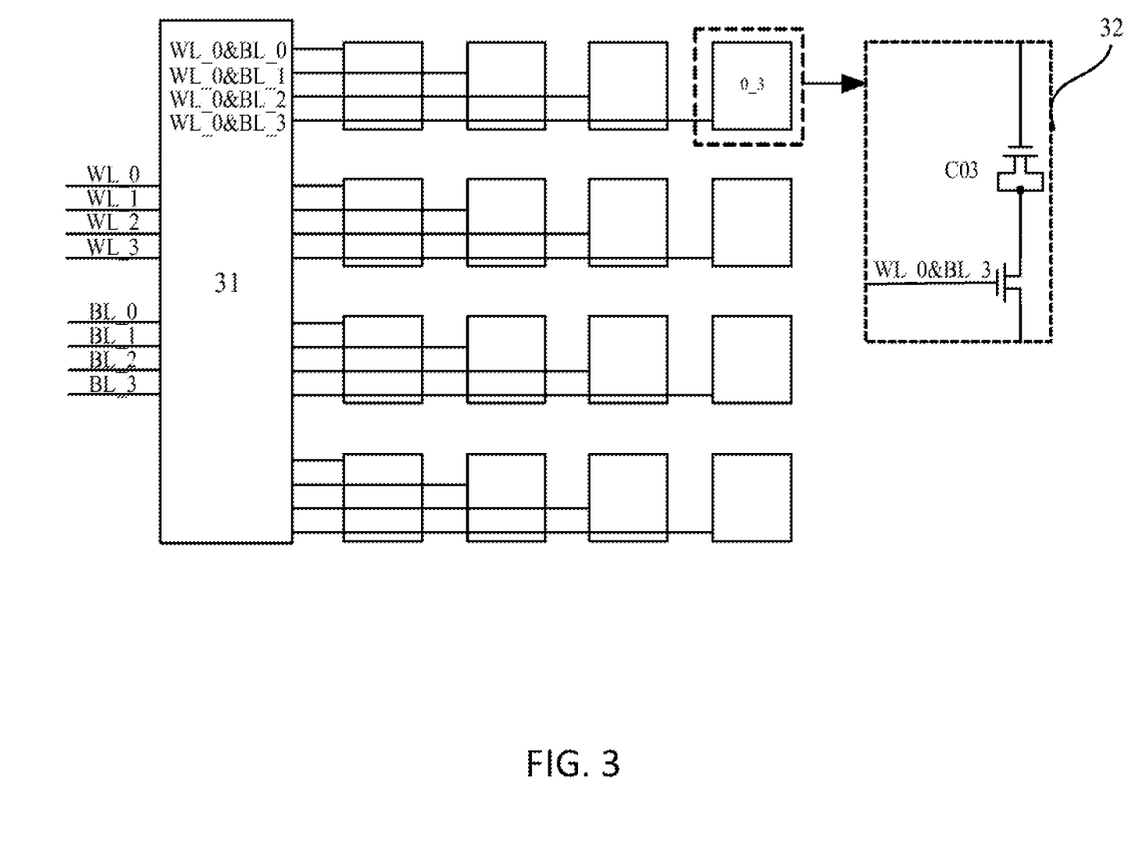
FIG. 3 is the signal connection diagram of the antifuse units in the circuit of FIG. 2.

FIG. 3 is a schematic diagram of the signal connection of the antifuse unit in circuit shown in FIG. 2.

Referring to the embodiment of the present disclosure in FIG. 3, each antifuse unit 32 including an antifuse element C03 and a switching element is connected to only one control signal line, and the control signal line is connected to the output terminal of the logic circuit 31 for outputting the AND signals W_Lx & BL_y from different word line signals WL_x and bit line signals BL_y. For example, the antifuse 0_3 is connected to the AND signal WL_0 and BL_3. The input end of the logic circuit 31 is connected to all word lines and bit lines. When the numbers of word lines and bit lines are large, the logic circuit 31 can convert m+n word line/bit line signals into m*n control signals. Compared with the complicated circuit connections in FIG. 1 (each fuse/antifuse unit needs to connect to three signal lines), the circuit connections of the antifuse units disclosed in the present embodiment are simpler and takes up less area.

Figure 4:
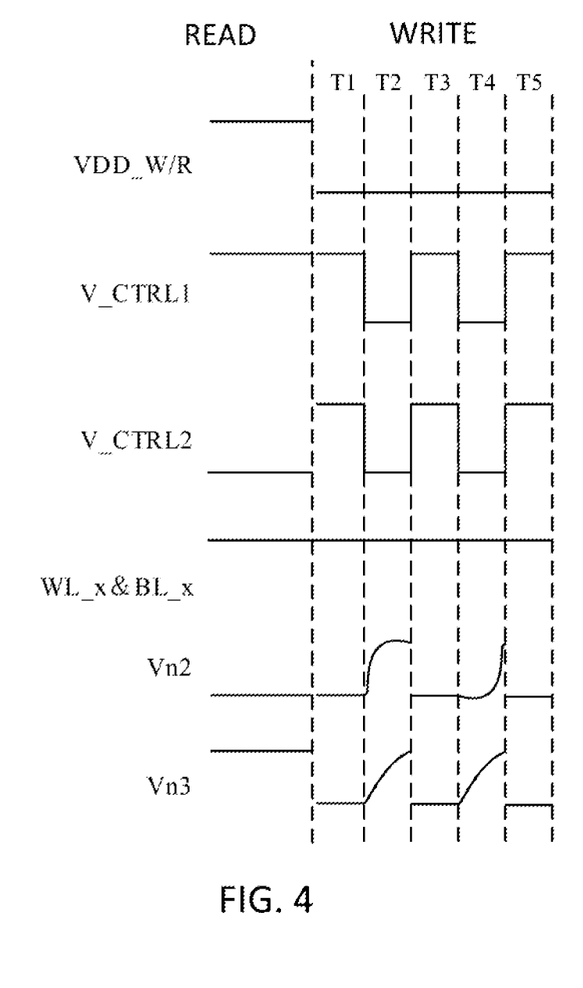
FIG. 4 is a timing diagram of control signals of the read-write circuit in an embodiment of the present disclosure.

FIG. 4 is a timing diagram of control signals of the read-write circuit according to an embodiment of the present disclosure.

Figure 5A:
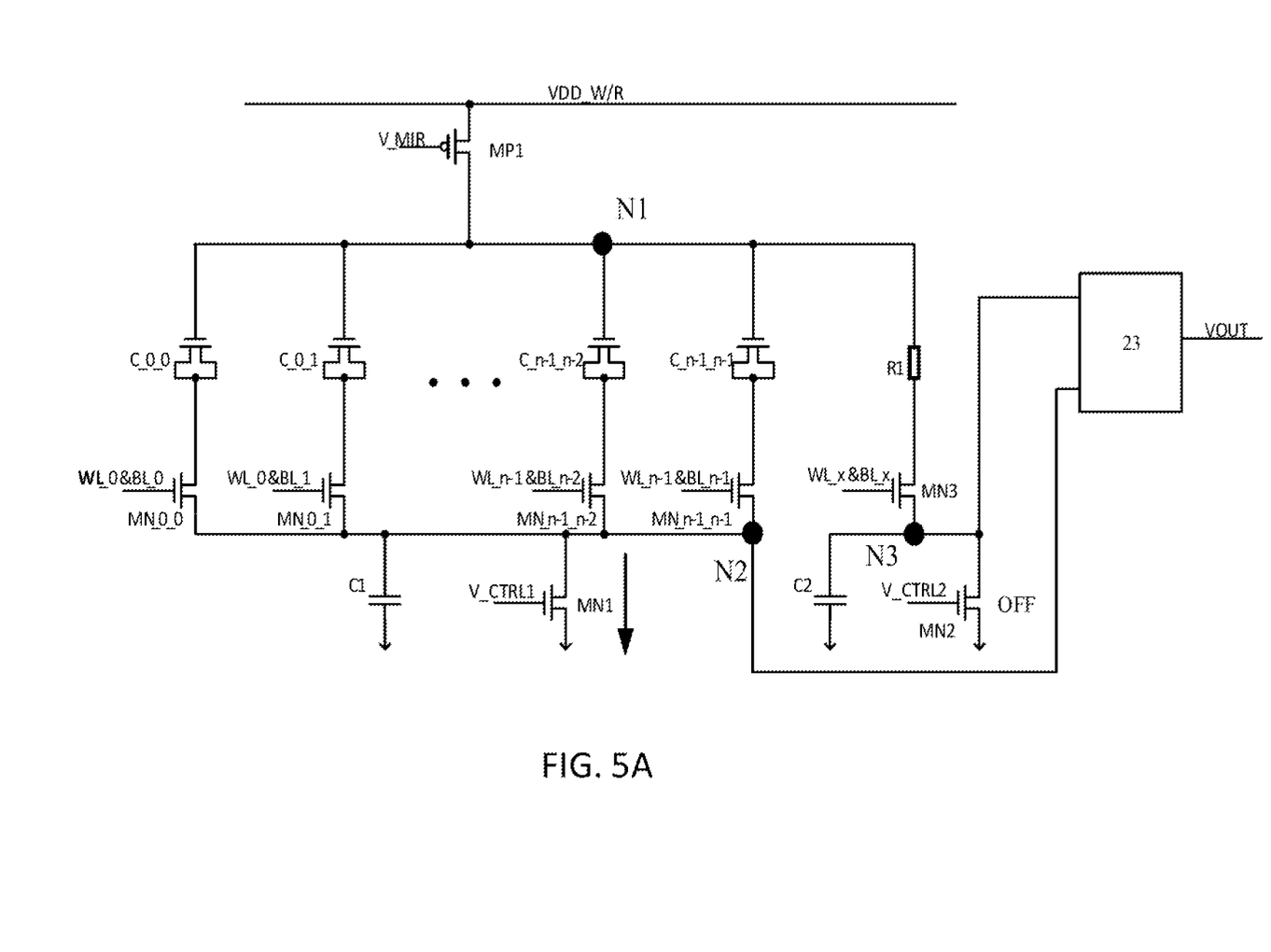
FIGS. 5A to 5C are schematic diagrams of the circuit states corresponding to the control timing shown in FIG. 4.
Figure 5B:
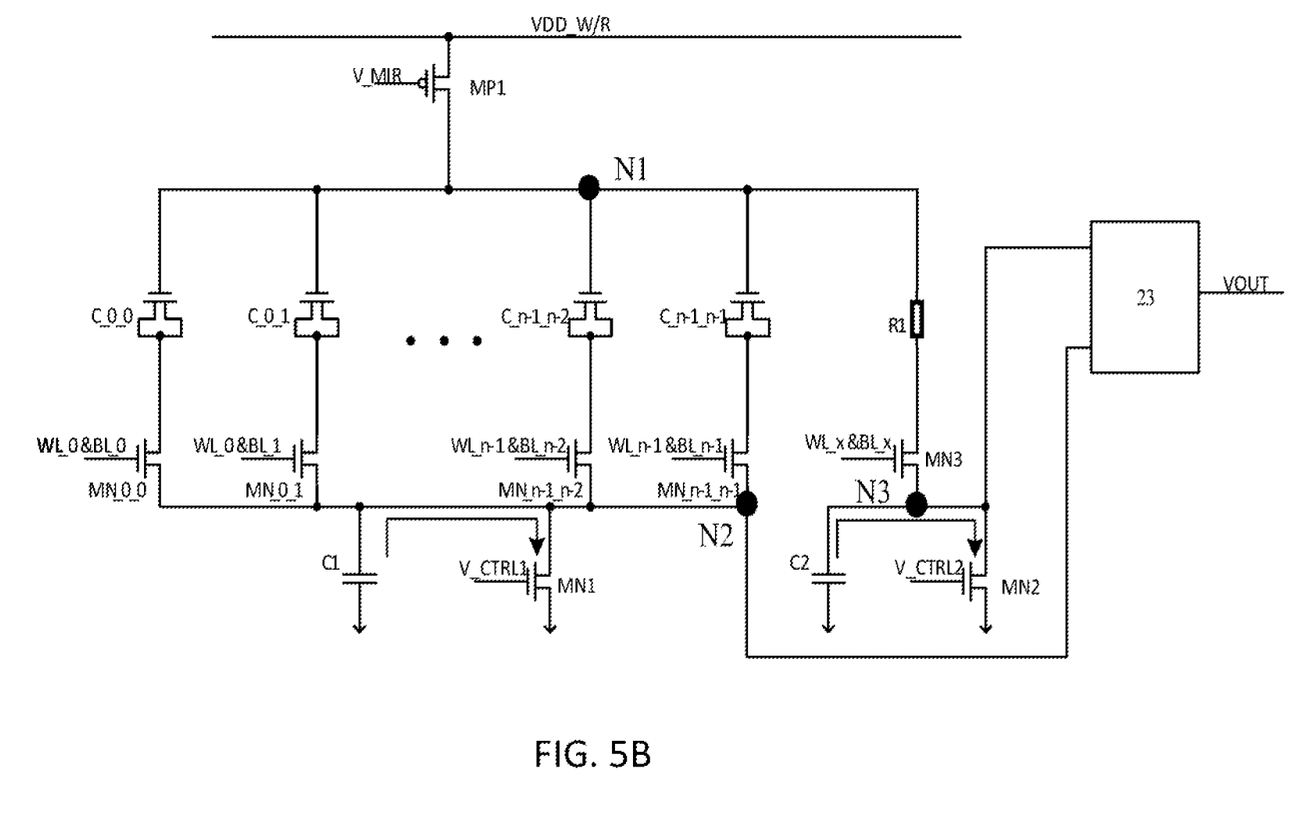
Figure 5C:
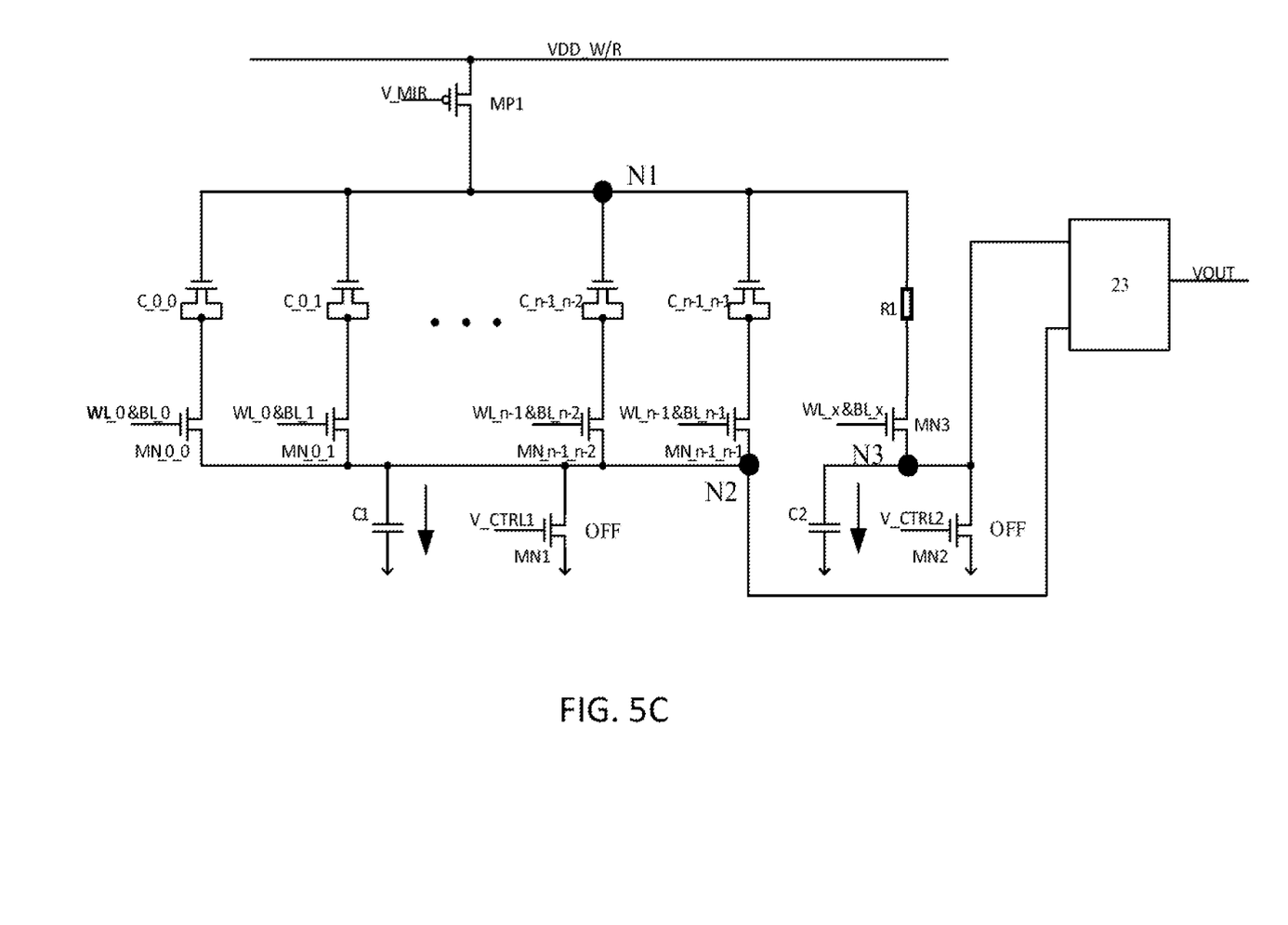

FIGS. 5A to 5C are schematic diagrams of the circuit states corresponding to the control timing shown in FIG. 4.

In the embodiment of FIG. 4, the first switching device MN1, the second switching device MN2, the reference switching device MN3, and the switching elements in each antifuse unit are all NMS switching transistors. At this time, each switching element is turned on at a high voltage level and turned off at a low voltage level. In other embodiments, each switch element may also be a PMOS switching transistor. In this case, the control signal may be adaptively adjusted according to the switching characteristics of the PMOS switching transistor, and the present disclosure is not limited to this example.

In FIG. 4 and FIG. 5A, according to the embodiment of the present disclosure, in the writing state (when the antifuse unit is programmed), the first voltage source VDD_W/R is at the first voltage level, and in the read state (when the state of the antifuse unit is detected), the first voltage source VDD_W/R is at the second voltage level. In some embodiments, the first voltage level is a high voltage (for example, 5~6V), and the second voltage level is a low voltage (for example, 1.0~1.2V).

In the writing state, the first control signal V_CTRL1 is at a high voltage level, the first switching element is turned on, and the second control signal V_CTRL2 is at a low voltage level, and the second switching element is turned off. At this time, if any word line signal is in the enabled state and any bit line signal is in the enabled state, the switching transistor of a certain antifuse unit is turned on, both ends of a certain antifuse element connected to the first voltage source and the second voltage source realize fused open, and the state changes irreversibly.

In FIG. 4 and FIGS. 5B and 5C, in the read state the first control signal V_CTRL1 and the second control signal V_CTRL2 are pulse signals with the same phase, and each pulse corresponds to one read signal output (one word line is in the enable state and one bit line is in the enable state), therefore, in one cycle of the pulse signal the first switching element and the second switching element undergo a simultaneous turn-on and simultaneous turn-off.

When reading the state of the antifuse unit corresponding to word line x and bit line y (where x and y are any positive integer less than n), word line x is in the enabled state, bit line y is in the enabled state, and the control signal of the reference device MN3 is in the enabled state, then the reference switching device MN3 is turned on. Therefore, in the read state, as long as any antifuse unit in the antifuse array is in the enabled state, the reference switching device MN3 is turned on. Similarly, if all the antifuse units in the antifuse array are not enabled, then the reference switching device MN3 is turned off.

Referring to FIG. 5B, when the first switching device MN1 and the second switching device MN2 are both turned on (corresponding to the WRITE phases T1, T3, and T5 in the timing diagram), the voltage of the second node is zero, and the first capacitor C1 discharges through the first switch device MN1; the voltage of the third node N3 is zero, and the second capacitor C2 discharges through the second switching device MN2. Therefore, in this interval, the voltages on the first capacitor C1 and the second capacitor C2 are both zero, in preparation for charging.

Referring to FIG. 5C, when the first switching device MN1 and the second switching device MN2 are both turned off (corresponding to WRITE phases T2 and T4 in the timing diagram), the first voltage source charges the second capacitor C2 through the mirror current source MP1, the reference resistor R1 and the reference switching device MN3, and the voltage of the third node N3 depends on the charging speed of the second capacitor C2.

At this moment, if the antifuse element C_x_y corresponding to the read word line x and the read bit line y is in an unprogrammed state (blocking state), the first voltage source charges the first capacitor C1 through the mirror current source MP1, the blocking resistor of the antifuse element C_x_y, and the switching element MN_x_y, and the voltage of the second node N2 depends on the charging speed of the first capacitor C1. If the antifuse of element C_x_y corresponding to the read word line x and the read bit line y is in the programmed state (conduction state), the first voltage source charges the first capacitor C1 through the mirror current source MP1, the on-resistance of the antifuse element C_x_y and the switching element MN_x_y, and the voltage of the second node N2 depends on the charging speed of the first capacitor C1. The Vn2 signal in the T2 stage in FIG. 4 corresponds to the charging state of the antifuse unit in the programmed state (enable state)—the resistance is small, so C1 charges faster, and the Vn2 signal in the T4 stage corresponds to the charging state of the antifuse unit in the unprogrammed state (disabled state)—the resistance is large so the charging speed of C1 is slow.

The comparison circuit 23 determines whether the currently read antifuse cell is programmed by comparing the voltages of the second node N2 and the third node N3. For example, in the T2 stage in FIG. 4, since Vn2 is significantly greater than Vn3 for a period of time, it can be determined that the current read antifuse unit is in the enabled state; in the T4 stage in FIG. 4, Vn2 is significantly smaller than Vn3 in a period of time, it can be determined that the current read antifuse unit is in the disabled state.

In the embodiment of the present disclosure, the charging speeds of the first capacitor and the second capacitor are controlled to maintain the voltage difference between the first capacitor and the second capacitor for a certain period of tune, thereby achieving voltage comparison.

The method of controlling the charging speed of the first capacitor and the second capacitor includes reducing the overall charging speeds and controlling the charging speed difference by the differences of resistance values, in the embodiment of the present disclosure, in order to facilitate control of calculation, the capacitance values of the first capacitor and the second capacitor may be set equal.

The method of reducing the overall charging speeds is, for example, by controlling the gate voltage of the mirror current source MP1. In the embodiment of the present disclosure, the control terminal of the mirror current source MP1 is connected to the control signal V_MIR, and the control signal V_MIR is provided by the voltage source/current source module. By setting the voltage value of V_MIR, the mirror current magnitude can be set when the mirror current source MP1 is turned on. When the mirror current source MP1 is turned on, its current can be determined according to the capacitance values (based on charging time) of the first capacitor C1 and the second capacitor C2. For example, when the capacitances of the first capacitor and the second capacitor are equal, and the capacitances of the first capacitor and the second capacitor are both in the range of 1~1000 fF, the mirror current can be set to 1~100 nA.

The method of controlling the difference in charging speed by the difference in resistance values may be, for example, setting the resistance value of the reference resistor R1 according to the resistances of the antifuse element before and after programming, that is, the blocking-resistance and the on-resistance.

Specifically, the blocking resistance value of the antifuse element is R_NP when it is not broken down, and the on-resistance value is R_P after it is broken down, the resistance of resistor R1 should be greater than R_P but less than R_NP, that is, the resistance of the reference resistor is set to be greater than the on-resistance value of the antifuse element but smaller than the blocking-resistance value of the antifuse element.

In general, R_P is two orders of magnitude or less smaller than R_NP. Therefore, in the present disclosure, R1 is set to be one order of magnitude larger than R_P, and R_NP is set to be one order of magnitude larger than R1, that is, the resistance of the reference resistor can be set less than or equal to one-tenth of the blocking-resistance of the antifuse element, and greater than or equal to ten times the on resistance of the antifuse element.

Thereafter, the resistance of the reference resistor R1 can be further determined by the preset charging time ratio of the capacitors C1 and C2 according to the design requirements. Finally, when the capacitances of the first capacitor C1 and the second capacitor C2 is in the range of 1~1000 fF, the resistance value of the reference resistor R1 can be set in the range of 1 KΩ~100 KΩ.

In the foregoing embodiment, the reference resistor R1 may be a fixed resistor or an adjustable resistor. Since the resistance value of a fixed resistor usually has an error, setting the reference resistor R1 as an adjustable resistor helps to provide more accurate control over capacitor charging time.

Take the antifuse element C_0_0 as an example, the resistance is R001 when it is not programmed, and the resistance is R002 after it is programmed, assuming R001=100*R002=10*R1, C1=C2, when reading the state of C_0_0, that is, the word line at 0 being the enable state, and bit line at 0 being the enable state, there are two cases to consider.

If C_0_0 is not programmed, the first voltage source VDD_W/R charges the first capacitor C1 through the mirror current source MP1, the blocking-resistance of the antifuse element C_x_y and the switching element MN_x_y, and charges the second capacitor C2 through the mirror current source MP1, the reference resistor R1, and the reference switching device MN3.

Assuming that the voltage of the first common node N1 is Vn1, the capacitance of the first capacitor C1 is C1, the charging time is t1, the capacitance of the second capacitor C2 is C2, and the charging time is t2, then:

$$((Vn1-Vn2)/R001)*t1=C1*Vn2 \quad (1)$$

$$((Vn1-Vn2)/R1)*t2=C2*Vn3 \quad (2)$$

which is:

$$Vn2=(t1*Vn1)/(t1+R001*C1) \quad (3)$$

$$Vn3=(t2*Vn1)/(t2+R1*C2) \quad (4)$$

under the condition C1=C2=c, that is, t1=t2=t, the following equation is derived:

$$Vn3/Vn2=(t+R001*c)/(t+R1*c) \quad (5)$$

when R001=100K, R1=10K, c=1000 f, t=1 μs, Vn3/Vn2≈10.

That is, when the resistance of the first resistor R1 is one-tenth of the blocking-resistance of the antifuse element, the voltage Vn3 of the third node N3 is 10 times the voltage Vn2 of the second node N2 within a period of time.

C_0_0 has been programmed, the first voltage source VDD_W/R (Thames the first capacitor C1 through the mirror current source MP1, the on-resistance of the antifuse element C_x_y and the switching element MN_x_y, and charges the second capacitor C2 through the mirror current source MP1, the reference resistor R1, and the reference switching device MN3. After replacing R001 (blocking-resistance) with R002 (on-resistance) in the above formulas (1), (3), (5), when R002-1K, R1=10K, c=1000 f, t=1 μs, Vn3/Vn2≈0.1.

That is, when the resistance of the first resistor R1 is ten times the on-resistance of the anti fuse element, the voltage Vn3 of the third node N3 is one-tenth of the voltage Vn2 of the second node N2 within a period of time.

Through the above setting method, regardless of whether the antifuse element has been programmed or not, the voltage of the second node and the voltage of the third node will have a large difference within a period of time. Therefore, the comparator 23 does not need to be highly sensitive to determine the status of the antifuse unit, thereby can greatly reduce the components' cost.

In summary, the present disclosure is able to not only simplify circuit connections and reduce the number of components, thereby improving circuit reliability, but also capable of reducing the parameter requirements for components, further saving manufacturing cost.

It should be noted that although several modules or units of the device for action execution are mentioned in the above detailed description, this modulization is not mandatory. In fact, according to the embodiments of the present disclosure, the features and functions of two or more modules or units described above may be embodied in one module or unit. Conversely, the features and functions of a module or unit described above can be further divided into multiple modules or units to be embodied.

Those skilled in the art will easily think of other embodiments of the present disclosure after considering the description and practicing the invention disclosed herein. This application is intended to cover any variations, uses or adaptive changes of the present disclosure. These variations, uses, or adaptive changes follow the general principles of the present disclosure and include common knowledge or conventional technical means in the technical field not disclosed in the present disclosure. The description and the embodiments are only regarded as exemplary, and the true scope and concept of the present disclosure are pointed out by the claims.

INDUSTRIAL APPLICABILITY

The embodiments of the present disclosure realize the following n*n antifuse units connected between the first common node and the second common node, a control signal controlling the opening and closing states of an antifuse unit, and the parallel connection connecting the first switching element and the first capacitor at the second node to the input of the comparator, and one reference array capable to compare the voltages at the second node, all of which achieved detection of the fuse states with a smaller number of components and a smaller circuit area, resulting improved reliability of the circuit.

What is claimed is:

1. A read-write circuit of one-time programmable memory, comprising:
an antifuse array, comprising:
n*n antifuse units, wherein each of the n*n antifuse units comprises an antifuse element and a switching element coupled together, wherein a first end of one of the n*n antifuse units is coupled to a first node, and a second end of said antifuse unit is connected to a second node, wherein a control end of the switching element in each of the n*n antifuse units is respectively coupled to an AND signal of a word line signal and a bit line signal different from word line signal, wherein a first node is coupled to a mirror current source, wherein the mirror current source is electrically connected to a first voltage source;
a first capacitor and a first switching device connected in parallel between the second node and a second voltage source, wherein a control terminal of the first switching device is connected to a first control signal;
a reference array, comprising:
a reference resistor and a reference switch element connected in series between the first node and the third node, wherein a control end of the reference switch element is coupled to an OR signal of n*n AND signals;
a second capacitor and a second switching device connected in parallel between the third node and the second voltage source, wherein a control terminal of the second switching device is coupled to a second control signal; and
a comparison circuit, wherein a first input terminal of the comparison circuit is coupled to the second node, a second input terminal is coupled to the third node, and wherein the comparison circuit compares a voltage at the second node and a voltage at the third node and determines if a programed operation occurs at said antifuse unit.

2. The read-write circuit of claim 1, wherein in a writing state, the first switching device is turned on and the second switching device is turned off; and wherein in a reading state, the first control signal and the second control signal are pulse signals having a same phase.

3. The read-write circuit according to claim 2, wherein in the read state, during a half cycle of the pulse signals, a ratio of the voltage of the second node to the voltage of the third node is greater than a first preset value, or the ratio of the voltage of the second node to the voltage of the third node is less than a second preset value.

4. The read-write circuit according to claim 2, wherein in the read state, when one word line is in an enabled state and one bit line is in an enabled state, the first switching device and the second switching device are turned on at a same time.

5. The read-write circuit of claim 1, wherein in the writing state, the first voltage source is at a first voltage level, wherein in the reading state, the first voltage source is at a second voltage level, and wherein the first voltage level is greater than the second voltage level.

6. The read-write circuit of claim 1, wherein the first switch device, the second switch device, and the reference switch element are all NMOS switching transistors.

7. The read-write circuit of claim 1, wherein a resistance value of the reference resistor is smaller than a blocking-resistance value of the antifuse element and greater than an on-resistance value of the antifuse element.

8. The read-write circuit of claim 2, wherein a resistance value of the reference resistor is less than or equal to one tenth of a blocking-resistance value of the antifuse element, and greater than or equal to ten times of an on-resistance value of the antifuse element.

9. The read-write circuit of claim 7, wherein the reference resistor is a variable resistor.

10. The read-write circuit of claim 1, wherein capacitance values of the first capacitor and the second capacitor are equal.

11. The read-write circuit according to claim 3, wherein in the read state, when one word line is in an enabled state and one bit line is in an enabled state, the first switching device and the second switching device are turned on at a same time.

12. The read-write circuit of claim 8, wherein the reference resistor is a variable resistor.

* * * * *